United States Patent [19]

Starcke et al.

[11] Patent Number: 5,853,826
[45] Date of Patent: Dec. 29, 1998

[54] METHOD OF IMPROVING THE COLOR OF TRANSPARENT MATERIALS

[75] Inventors: Steven F. Starcke; Ronald H. Kearnes; Keven E. Bennet; David A. Edmonson, all of Rochester, Minn.

[73] Assignee: Azotic Coating Technology, Inc., Rochester, Minn.

[21] Appl. No.: 704,992

[22] Filed: Aug. 29, 1996

[51] Int. Cl.[6] .................................................. A44C 17/00
[52] U.S. Cl. ............................... 428/15; 63/32; 427/162; 427/453
[58] Field of Search .............................. 428/15; 427/162, 427/453; 63/32

[56] References Cited

U.S. PATENT DOCUMENTS

| | | | |
|---|---|---|---|
| 2,690,630 | 10/1954 | Eversole et al. | 63/32 X |
| 3,039,280 | 6/1962 | Flad et al. | 63/32 |
| 3,490,250 | 1/1970 | Jones | 63/32 |
| 4,039,726 | 8/1977 | Carr et al. | 428/409 X |
| 4,809,417 | 3/1989 | Normann, Jr. | 428/15 X |

*Primary Examiner*—Henry F. Epstein
*Attorney, Agent, or Firm*—Antonelli, Terry, Stout & Kraus, LLP

[57] ABSTRACT

A faceted gemstone having at least one thin layer of material coated on the pavilion of a transparent substrate so that the body of the gemstone appears to have a different color. The color of reflected light changes hues when viewed through the face of the gemstone at different angles of observation. This causes the gemstone to appear to change color when the stone is tilted. The thin film is coated by low temperature techniques such as sputtering.

16 Claims, No Drawings

METHOD OF IMPROVING THE COLOR OF TRANSPARENT MATERIALS

BACKGROUND OF THE INVENTION

The present invention relates to a method for altering the appearance of objects such as gemstones or decorative objects. More particularly, the present invention relates to altering and enhancing the appearance of objects such as gemstones by coating the objects with thin film coatings which provide color via optical interference for a decorative effect.

A number of processes have been developed to improve the appearance of gemstones or to create simulated gemstones. Diffusion of ions into gemstones, such as titanium and/or iron into sapphire to give a blue color have been disclosed. This process is limited to specific ions and specific substrates. This process requires extremely high temperatures which frequently damages the substrates. Diffusion processes cause the added ions to become part of the crystal surface with no distinct boundary and usually form a gradient of ion concentration in the base substrate. Examples of diffusion processes include U.S. Pat. Nos. 2,690,630 and 4,039,726.

Tavelite™ is a product produced by depositing thin multiple layers on a transparent substrate to produce an interference effect. The process utilizes high temperatures and frequently results in substantial breakage of the product.

Aqua-aura™, a product of Vision Industries is a surface treatment providing a single, moderately saturated, color. This process is proprietary but is reported to be a coating based upon gold and the use of high temperatures.

Nuclear radiation has been used to produce color centers in gemstones, giving a body color that can sometimes be improved with heat treatment. Cyclotrons and neutron bombardment are routinely used to impart blue color to colorless topaz.

Rhinestones and Carnival Glass have reflective coatings layered on one or more surfaces of a clear substrate. The coating is usually silver or some other highly reflective material utilized to apply a mirror coating (usually silver or aluminum) onto the pavilion (back) of a faceted glass gem. In such a coating, all light is reflected without passing through the coating. A representative patent is U.S. Pat. No. 3,039,280. Atmospheric pressure chemical vapor deposition have been used to deposit films of titanium oxide by the thermal decomposition of a titanium compound (usually $TiCl_4$) in air.

Layered coatings on a surface of gemstones have been done to increase the "fire" of the stone. These techniques involve the coating of a highly refractive material, with respect to the gemstone's index of refraction, followed by a second coating of a different highly refractive material. The layers are designed so that the reflected light at each interface of each layer causes an optical interference effect. An example of such a method is U.S. Pat. No. 3,490,250.

While numerous techniques to improve the decorative effects of various gemstones and other items have been disclosed, none cause the stone to reflect a different color light depending on the angle of view so that the body of the stone appears to change color as the angle of view changes.

SUMMARY OF THE INVENTION

It is an object of the present invention to provide gemstones and other decorative objects with enhanced color by a rapid and low cost method.

It is another object of the present invention to enhance the color of gemstones without damage or breakage of the gemstones.

It is a further object of the present invention to enhance the color of gemstones by using a low temperature process.

It is yet another object of the present invention to provide a durable coating to the pavilion of a gemstone to cause an optical interference effect to reflect different colors.

It is still a further object of the present invention to provide a plurality of very thin coatings on a substrate.

It is yet a further object of the present invention to provide a decorative object which reflects different colors or appears to have different body colors when viewed from a different angle.

These objects are achieved by the present invention providing transparent, translucent or opaque coatings to a transparent or translucent substrate which can provide a range of brilliant, saturated colors to muted pastels as desired for the decorative object. Modification of the coating thickness and composition of the various thin film layers allow for the development of coatings with different physical properties, such as hardness, as well as the desired optical properties. According to the present invention, the appearance of the coating changes with surface finish, thickness and refractive index, providing a wide range of hues and interesting decorative designs.

The present invention has a range of effects on the optical properties of the gemstone or decorative object depending upon any underlying reflective material, the refractive index of the substrate material, and the refractive index of the layers forming the coating. The color of the reflected light changes as one views the object from a different angle. This causes the stone or decorative object to appear to change colors when moved at an angle with respect to the viewer. The invention can be prepared by coating the substrate with a single layer or multiple layers, resulting in a similar optical effect, but dramatically different to the eye of the viewer.

The present invention is prepared by a low-temperature method which does not substantially alter the dimensions or surface composition of the decorative object's substrate other than to coat its surface.

DETAILED DESCRIPTION OF THE PREFERRED EMBODIMENT

Various materials have inherent color and reflectivity/transmission characteristics which do not lend themselves well for use as decorative items. Examples include such low cost transparent gem materials such as colorless quartz ($SiO_2$), topaz ($AL_2SiO_4F_2$) and beryl ($AL_2Be_2Si_6O_{18}$). To enhance the decorative properties to such gem materials, pigments and dyes have been used to provide body colors to stones with cracks into which the dye penetrates. These impart a color change in the base gem material. The present invention teaches techniques that apply a thin (multi-angstrom in thickness) film coating which does not materially change the dimension or underlying structure of the substrate. The coating may provide constructive and/or destructive interference of light to provide coloration pleasing to the eye of the observer.

The thin layer(s) may also serve as an absorber of certain light frequencies or provide differential reflectivity to produce the appearance of various colors. Different colors are also caused by interference due to one layer of the coating having a different refractive index from the substrate material or adjacent layers in the thin film coating. This method is, in principle, the same as that of fabricating dichroic filters and dichroic mirrors. The difference in this application is that the coatings are used as a second surface dichroic mirror.

The present invention relates to the enhancement of gemstones and other decorative articles. The substrate is made from materials found naturally formed in the earth, synthetic, laboratory made, and/or a variety of simulant materials. The method of the present invention enhances the color and brilliance of faceted or cabochon cut stones by the application of thin-films with specific optical properties to the pavilion or back of the stone. The effect of these thin films is to modify the intensity and color of the light reflected to the eye of the observer from the stone.

An article, for example, a glass object, a cut gemstone or a natural crystal structure such as a mineral, is coated with a thin coating to provide an iridescent optical display for improving the appearance of the decorative article. While the coating of gemstones is preferred, the present invention may be applied to a large number of transparent or translucent substrates where one desires to alter the optical properties of the substrate. Each layer of the coating is generally very thin on the order of about 10 to about 200 angstroms for a first coating and about 500 to about 12,000 angstroms for a second coating. A thickness of about one quarter of a wavelength of light or odd multiples thereof generally subtract the color of light corresponding to the wavelength from the reflected light.

The layers may have a different index of refraction from the substrate which further alters the passage of light through the decorative object. However, this is not necessary. One preferred embodiment is to have all of the layers the same or approximately the same index of refraction as the substrate. In this situation, it is particularly desirable to have the amount of light reflected from the substrate/first layer interface be about the same amount of light that is reflected from the final layer/air interface.

Each layer may have uneven thickness to give an even greater variety of display. When a pavilion of a faceted gemstone is coated by sputtering, this coating technique can apply a thicker coating layer to the top of the stone than the bottom of the pavilion. Individual facets may also receive different coating thickness based upon the angle they make with respect to the target during sputtering.

A single layer coating of titanium oxide tends to produce pastel colors. Two layers produce more vibrant colors and wider ranges of color shifts. Three or more layers may be used for more complex displays and color possibilities.

By carefully applying plural coatings and adjusting the thickness of each coating, one can achieve a variety of reflections at the interfaces, dispersions and optical interference patterns. While the interference effect could be of a narrow band of visible wavelengths, a pleasing effect is also produced by a selected non-uniform coating which provides a display of a range of colors to the eye of the observer.

The coating material may be composed of a variety of transparent, translucent or opaque materials. Examples includes metals, metal oxides, nitrides, sulfides and transparent carbon. Titanium, aluminum, boron, carbon, zirconium, hafnium, niobium, vanadium, tungsten, chromium, zinc are representative useful metals. Particularly preferred are titanium and titanium oxides, and, zirconium and zirconium oxides. The coating material may be amorphous or crystalline and may be composed of materials generally thought to be opaque but in very thin films are at least translucent and/or at least partially reflective.

The preferred areas for coating a gemstone are the pavilion of the stone. Faceted gems are usually set in jewelry with the pavilion protected by the setting. The setting protects the coating from mechanical abrasion which can occur when the stone is worn as an ornament.

Coating the pavilion selectively is also advantageous because it results in a more uniform color imparted to the stone. The viewing angle is limited by the setting to the top of the gemstone, resulting in a more natural appearance of the gem since the effect of the coating is viewed through the stone. This gives the appearance of the entire stone having the color imparted by the coating. The top surface, the crown of the gemstone, is uncoated; thus, the "luster" or light reflected of the surface of the stone remains the same as the original stone since the reflection characteristics of the crown remain unchanged.

The coating may be of one or plural layers. Each layer may be of uniform thickness or of uneven thickness to give a gradient or plurality of colors in light. The coating is of sufficient thickness that the color shifts when viewed from different angles. Each coating layer will reflect some light at the interface and refract light to later reflect it off the backside of the decorative object at a different angle or at a different wavelength.

Optical interference phenomena is also produced by the present invention. The first layer of coating material absorbs certain wavelengths of light or is partially reflective. The first coating material does not require any particular index of refraction and may be the same as the substrate. Representative thicknesses range from about 10 to about 200 angstroms thick. A second layer is made of a material having a high index of refraction to increase reflection of light. Representative thicknesses range from about 500 to about 12,000 angstroms thick. The coating may also form a dichroic coating. All of the possible layers may function in cooperation with an overlaid reflective coating and/or a protective layer. The coatings are designed to cause a color change in the light reflected, particularly when viewed from different angles. The choice of colors to be emitted would be determined by what coating(s) applied. By judicious selection of coating materials and their thickness, (one quarter wavelength thick and odd multiples thereof) one can have almost any color on the decorative object which will shift to almost any other color when viewed from a different angle.

The coating may be applied by a number of methods. All of these methods employ low temperatures so as to not affect the gemstone or decorative object other than to coat its surface. For the purposes of this application, low temperatures are defined as those temperatures not affecting the chemical structure of the gemstone or decorative object, such as by melting, decomposing, chemically activating it, etc. Low temperatures generally are less than about 200 degrees Celsius. Representative low temperature coating techniques include:

(1) Sputtering applies energy or an inert gas (i.e. argon) to a material so as to eject energetic ions, atoms or molecules which then physically or chemically react with a substrate to be coated. The ejected material may be produced by positive ions striking a cathode to eject the cathode material. Radio-frequency or direct current glow discharges also directly produce reactive ions, atoms and molecules for coating a substrate. For the present invention, the decorative object or gemstone is the substrate and its pavilion is coated by ions or atoms sputtered from a bombarded material. This method is generally employed at subatmospheric pressures and preferably at a near vacuum other than for the coating material in gaseous form.

For the present invention, the preferred method for coating a surface of a substrate is by reactive sputtering. For this technique, oxygen or other reactive gas is added to the inert gas to react with the sputtered material. When applying plural coats of material on the substrate, the same low temperature coating technique may be applied with a different coating material or by a different coating technique. In the situation of reactive sputtering, a different target and/or a different reaction gas may be used without moving the substrate being coated.

(2) Chemical vapor deposition (CVD) and physical vapor deposition (PVD) involve the passage of an active or reactive gas in an inert carrier gas across the surface of the decorative object being coated. The reaction gas then decomposes or is caused to react with components in the gas or the substrate to coat the substrate.

(3) Arc Source deposition is the use of direct current to ionize coating materials for coating a substrate. At lower currents, a glow discharge is produced and also may be used. The arc may be directly applied by making the substrate a workpiece anode. Alternatively, a plasma jet of excited gases may be applied to the surface of the substrate or gemstone to coat it. For such a coating method, the atmosphere is carefully controlled and usually involve subatmospheric pressures. The gas injected around the arc to be converted into a plasma may be inert, neutral, oxidizing or reducing depending on the particular coating desired on the substrate.

In evaporation, two or more sources of particles to form the coating material are aimed at a heated substrate, which in a preferred embodiment is the pavilion of the gemstone. In ultrahigh vacuums, a molecular beam epitaxy apparatus may form a single crystal coating layer on the substrate.

(4) Low pressure chemical vapor deposition (LPCVD) involves the placing of the substrate in a vacuum chamber along with the coating material. The coating material is heated, typically by being placed in a heated vessel within the vacuum chamber. Under low pressure, the chemical vapor is evaporated and deposited as a thin film layer on the substrate.

In each of these techniques, the thickness of the coating may be easily changed by modifying the conditions during the coating methods. For example, when the layer is applied by sputtering, the duration of the sputtering treatment determines the thickness. When coating the substrate by sputtering, the treatment time will vary depending on the particular apparatus but generally ranges from about 5 minutes to about 30 minutes. A single thin coating may even be applied in a few seconds.

Adjusting the thickness of the coating directly affects the color and other optical properties of the gemstone or other decorative object. In such a manner, the method may be used to apply different thickness layers to different parts of the gemstone yielding different colors or shades of the same color within the same treated gemstone.

EXAMPLE

A base substrate of faceted gemstones of white topaz were coated with titanium metal by reactive sputtering in argon gas to a thickness of about 100 angstroms. This formed a semitransparent thin coating also known as flash. Only the pavilion of the gemstone was coated. Titanium dioxide was then coated by reactive sputtering in argon and oxygen gas to a thickness of about one fourth of a wavelength of light thickness, or odd multiples thereof, depending on the particular wavelength of light one wishes to subtract. This second layer was applied on the same area as a second layer coating the gemstone.

The untreated gemstones of topaz have a colorless solid body color. After coating them by the above method, the gemstones had an apparent color shifting from green to violet when viewed through the face of the gemstone at slightly different angles.

The foregoing description of the specific embodiments reveal the general nature of the invention so that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation.

All references mentioned in this application are incorporated by reference.

What is claimed is:

1. A method for enhancing optical properties of a decorative object being composed primarily of a transparent or translucent substrate comprising the step of vapor-coat a part of the surface of the substrate with a first layer of a first coating material at a low temperature, wherein the color of light reflected from the decorative object to a viewer changes with an angle of observation.

2. The method according to claim 1 wherein the substrate is a gemstone and a pavilion of the gemstone is coated.

3. The method according to claim 2, wherein the coating imparts a dichroic coating to the surface of the substrate.

4. The method according to claim 1, further comprising the step of coating the surface of the substrate at a low temperature with a second layer of a material different from a first coating material.

5. The method according to claim 4, wherein the surface of the substrate is coated with titanium metal as the first layer and titanium oxide as the second layer.

6. The method according to claim 5, wherein the surface of the substrate is a gemstone and a pavilion of the gemstone is coated.

7. The method according to claim 1, wherein the coating imparts a dichroic coating to the surface of the substrate.

8. The method according to claim 1, wherein the first layer is a different material from the substrate.

9. A decorative object comprising a transparent or translucent substrate wherein a part of the surface of the substrate is vapor-coated with a first layer of material, wherein the color of light reflected from the decorative object when viewed from one angle changes to another color when viewed from a different angle.

10. The decorative object according to claim 9, wherein said substrate is a gemstone and the pavilion of the gemstone is coated.

11. The decorative object according to claim 10, wherein the surface of the substrate has a dichroic coating.

12. The decorative object according to claim 9, further comprising a second layer of material coated on the first layer of material.

13. The decorative object according to claim 12, wherein the surface of the substrate is coated with titanium metal as the first layer and titanium oxide as the second layer.

14. The decorative object according to claim 13, wherein the substrate is a gemstone and a pavilion of the gemstone is coated.

15. The decorative object according to claim 9, wherein the surface of the substrate has a dichroic coating.

16. The decorative object according to claim 9, wherein the first layer is a different material from the substrate.

* * * * *

UNITED STATES PATENT AND TRADEMARK OFFICE
CERTIFICATE OF CORRECTION

PATENT NO. : 5,853,826  
APPLICATION NO. : 08/704992  
DATED : December 29, 1998  
INVENTOR(S) : Steven F. Starcke et al.

Page 1 of 1

It is certified that error appears in the above-identified patent and that said Letters Patent is hereby corrected as shown below:

TITLE PAGE, ITEM (75) INVENTORS:

DELETE "Keven E. Bennet", AND  
INSERT --Kevin E. Bennet--.

Signed and Sealed this

Sixth Day of March, 2007

JON W. DUDAS  
*Director of the United States Patent and Trademark Office*

US005853826C1

(12) EX PARTE REEXAMINATION CERTIFICATE (5886th)
United States Patent
Starcke et al.

(10) Number: US 5,853,826 C1
(45) Certificate Issued: Sep. 11, 2007

(54) METHOD OF IMPROVING THE COLOR OF TRANSPARENT MATERIALS

(75) Inventors: Steven F. Starcke, Rochester, MN (US); Ronald H. Kearnes, Rochester, MN (US); Kevin E. Bennet, Rochester, MN (US); David A. Edmonson, Rochester, MN (US)

(73) Assignee: Azotic Coating Technology, Inc., Rochester, MN (US)

Reexamination Request:
No. 90/008,160, Aug. 9, 2006

Reexamination Certificate for:
Patent No.: 5,853,826
Issued: Dec. 29, 1998
Appl. No.: 08/704,992
Filed: Aug. 29, 1996

Certificate of Correction issued Mar. 6, 2007.

(51) Int. Cl.
*A44C 17/00* (2006.01)
*C23C 14/08* (2006.01)
*C23C 14/18* (2006.01)
*C23C 28/00* (2006.01)
*B44F 1/14* (2006.01)
*B44F 1/00* (2006.01)

(52) U.S. Cl. .................. 428/15; 427/162; 427/453; 63/32

(58) Field of Classification Search .................. None
See application file for complete search history.

(56) References Cited

U.S. PATENT DOCUMENTS

| | | | |
|---|---|---|---|
| 2,430,452 A | 11/1947 | Colbert |
| 2,466,119 A | 4/1949 | Moulton |
| 2,519,547 A | 8/1950 | Colbert |
| 2,587,972 A | 3/1952 | Crise |
| 3,306,768 A | 2/1967 | Peterson |
| 3,490,250 A | 1/1970 | Jones |
| 3,755,025 A | 8/1973 | Jones |
| 3,837,884 A | 9/1974 | Rheinberger |
| 4,030,317 A | 6/1977 | Rogell |
| 4,705,356 A | 11/1987 | Berning |
| 4,749,869 A | 6/1988 | Fournier |
| 4,797,308 A | 1/1989 | Mattin |
| 5,054,902 A | 10/1991 | King |
| 5,080,455 A | 1/1992 | King |
| 5,173,766 A | 12/1992 | Long |
| 5,235,462 A | 8/1993 | Bidermann |
| 5,454,235 A | 10/1995 | Freiesleben |
| 5,657,646 A | 8/1997 | Rosenberg |
| 5,718,760 A | 2/1998 | Carter |
| 6,197,428 B1 | 3/2001 | Rogers |

FOREIGN PATENT DOCUMENTS

| EP | 0248525 | 12/1987 |
| JP | 63-049704 | 3/1988 |
| JP | 06-250016 | 9/1994 |

OTHER PUBLICATIONS

Merriam–Webster's Collegiate Dictionary, Tenth Edition, Merriam–Websters, Inc, 1998 (p. 321).*
Hadley, Wayne Aqua Aura: "A revolutionary Enhancing Process Turns Quartz into a Rainbow" Rock and Gem (May 1989).
Welcome to Jewellery Online, Dichroic Glass Jewellery Online (website), Gairloch, Ross–shire, Scotland, 2003 (3 pgs).
Dichroic Style, DichroicStyle.com (website), 2003 (4 pgs).
DichroMagic—State of the Art Dichroic Glass (website), 2003 (7 pgs).
Halliday et al., Physics Part II, Chapter 43, John Wiley & Sons, Inc., pp. 1069–1094 (citing works from the years 1803, 1819–1903, 1881, etc.).
Tavalite Enterprises of Sonoma, Press (website), reprint from AJM magazine, Jul. 1999, reprint from Professional Jeweler Aug. 1998, reprint from Gems & Gemology Summer 1996, reprint from Jewelers' Circular Keystone May 1997 (8 pgs).
Dichroic—explanation guide (website), Mar. 31, 2005 (2 pgs).
Dema Designs—About Dichroic Glass (website), 2003 (6 pgs).
Interference Filters, Ealing Optics Catalog, 1981, South Natick, MA (4 pgs).
Dichroic Alchemy—Liberating Creativity in Glass (website), 2002–2004 (3 pgs).
The origins of color in minerals, American Mineralogist, vol. 63, 1978, pp. 219–229 (16 pgs).
Dichroic Glass (website) Mar. 29, 2005 (2 pgs).
Mysteries of Dichroic Glass (website) Sep. 20, 1996 (6 pgs).

* cited by examiner

*Primary Examiner*—Stephen Stein

(57) ABSTRACT

A faceted gemstone having at least one thin layer of material coated on the pavilion of a transparent substrate so that the body of the gemstone appears to have a different color. The color of reflected light changes hues when viewed through the face of the gemstone at different angles of observation. This causes the gemstone to appear to change color when the stone is tilted. The thin film is coated by low temperature techniques such as sputtering.

US 5,853,826 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2, 3, 6, 7, 10, 11, 14 and 15 are cancelled.

Claims 1, 4, 5, 8, 9, 13 and 16 are determined to be patentable as amended.

Claim 12, dependent on an amended claim, is determined to be patentable.

New claims 17–35 are added and determined to be patentable.

1. A method for enhancing optical properties of a decorative object being composed primarily of a transparent or translucent substrate, *the substrate being a gemstone, the gemstone having a pavilion and a top, the method* comprising the step of *selectively* vapor-[coat]*coating* a part of the surface of the [substrate] *gemstone* with a first layer of a first coating material at a low temperature, *wherein said part that is vapor coated is the pavilion of the gemstone,* wherein the color of light reflected from the [decorative object] *gemstone* to a viewer changes with an angle of observation, *such that the gemstone has a body color, and the body color when viewed through the gemstone's top from one angle changes to another color when viewed through the gemstone's top from a different angle*.

4. The method according to claim 1, further comprising the step of coating the [surface] *pavilion* of the [substrate] *gemstone* at a low temperature with a second layer of a material different from [a] *said* first coating material.

5. The method according to claim 4, wherein the [surface] *pavilion* of the [substrate] *gemstone* is coated with titanium metal as the first layer and titanium oxide as the second layer.

8. The method according to claim 1, wherein the first layer is a different material from the [substrate] *gemstone*.

9. A decorative object comprising a transparent or translucent substrate, *the substrate being a gemstone having a pavilion and a top,* wherein a part of the surface of the [substrate] *gemstone* is vapor-coated with a first layer of material, *wherein said part that is vapor-coated is the pavilion of the gemstone, the gemstone's top being uncoated,* wherein the color of light reflected from the [decorative object] *gemstone to a viewer changes with an angle of observation, such that the gemstone has a body color, and the body color* when viewed *through the gemstone's top* from one angle changes to another color when viewed *through the gemstone's top* from a different angle.

13. The decorative object according to claim 12, wherein the [surface] *pavilion* of the [substrate] *gemstone* is coated with titanium metal as the first layer and titanium oxide as the second layer.

16. The decorative object according to claim 9, wherein the first layer is a different material from the [substrate] *gemstone*.

17. *The method according to claim 1, wherein the first layer is deposited at a thickness of between about 10 angstroms and about 200 angstroms.*

18. *The method according to claim 1, wherein the vapor-coating deposits a thin film coating, comprising the first layer, creating an optical interference effect that causes the body color when viewed from one angle to change to another color when viewed from a different angle.*

19. *The method according to claim 4, wherein the first layer is deposited at a thickness of between about 10 angstroms and about 200 angstroms, and the second layer is deposited at a thickness of between about 500 angstroms and about 12,000 angstroms.*

20. *The method according to claim 19, wherein the second layer is deposited at a ¼ visible-wavelength thickness or an odd multiple thereof.*

21. *The method according to claim 1, wherein the gemstone is selected from the group consisting of colorless topaz, quartz, and beryl.*

22. *The method according to claim 1, wherein the vapor-coating comprises sputtering that produces reactive ions for said coating of the gemstone's pavilion.*

23. *The method according to claim 22, wherein the vapor-coating involves depositing plural coats of material on the gemstone's pavilion, and the sputtering is reactive sputtering where the plural coats are deposited without moving the substrate but using different sputtering targets, different reaction gases, or both.*

24. *The method according to claim 1, wherein the vapor-coating comprises chemical vapor deposition or physical vapor deposition involving a reaction gas that decomposes on the substrate, or reacts with the substrate or other gas components, to effect said coating of the gemstone's pavilion.*

25. *The method according to claim 1, wherein the vapor-coating comprises arc source deposition where direct current is used to ionize coating material to effect said coating of the gemstone's pavilion.*

26. *The method according to claim 1, wherein the first layer is deposited as film having an index of refraction matching that of the gemstone.*

27. *The method according to claim 1, wherein the vapor-coating involves depositing three or more layers on the gemstone's pavilion.*

28. *The decorative object according to claim 9, wherein the first layer is deposited at a thickness of between about 10 angstroms and about 200 angstroms.*

29. *The decorative object according to claim 9, wherein said vapor coating is a thin film coating, comprising the first layer, creating an optical interference effect that causes the body color when viewed from one angle to change to another color when viewed from a different angle.*

30. The decorative object according to claim 12, wherein the first layer has a thickness of between about 10 angstroms and about 200 angstroms, and the second layer has a thickness of between about 500 angstroms and about 12,000 angstroms.

31. The decorative object according to claim 30, wherein the second layer has a ¼ visible-wavelength thickness or an odd multiple thereof.

32. The decorative object according to claim 9, wherein the gemstone is selected from the group consisting of colorless topaz, quartz, and beryl.

33. The decorative object according to claim 9, wherein the first layer has an index of refraction matching that of the gemstone.

34. The decorative object according to claim 9, wherein said vapor coating comprises three or more layers on the gemstone's pavilion.

35. The decorative object according to claim 9, wherein the gemstone is provided in combination with a jewelry setting in which the gemstone is set such that the gemstone's pavilion is protected by the setting.

* * * * *